United States Patent
Gopalan et al.

(10) Patent No.: US 11,047,035 B2
(45) Date of Patent: Jun. 29, 2021

(54) PROTECTIVE YTTRIA COATING FOR SEMICONDUCTOR EQUIPMENT PARTS

(71) Applicant: Applied Materials, Inc., Santa Clara, CA (US)

(72) Inventors: Ramesh Gopalan, Fremont, CA (US); Yixing Lin, Saratoga, CA (US); Tasnuva Tabassum, San Jose, CA (US); Siamak Salimian, Los Altos, CA (US); Yikai Chen, San Jose, CA (US); Kevin Papke, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/274,141

(22) Filed: Feb. 12, 2019

(65) Prior Publication Data

US 2019/0264314 A1     Aug. 29, 2019

Related U.S. Application Data

(60) Provisional application No. 62/634,235, filed on Feb. 23, 2018.

(51) Int. Cl.
  *C23C 4/11*    (2016.01)
  *C23C 4/134*   (2016.01)
  (Continued)

(52) U.S. Cl.
  CPC .............. *C23C 4/11* (2016.01); *C23C 4/134* (2016.01); *H01L 21/67011* (2013.01); *H01L 21/68757* (2013.01)

(58) Field of Classification Search
  CPC ..... C23C 4/11; C23C 4/134; H01L 21/68757; H01L 21/67011
  See application file for complete search history.

(56) References Cited

U.S. PATENT DOCUMENTS

| 3,796,182 A | 3/1974 | Rosler |
| 4,371,570 A | 2/1983 | Goebel et al. |

(Continued)

FOREIGN PATENT DOCUMENTS

| CA | 2297543 | 9/2000 |
| DE | 10224137 A1 | 12/2003 |

(Continued)

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — Daniel J. Schleis
*Assistant Examiner* — Kevin Ct Li
(74) *Attorney, Agent, or Firm* — Lowenstein Sandler LLP

(57) ABSTRACT

Disclosed herein is a poly-crystalline protective coating on a surface of a chamber component. The poly-crystalline protective coating may be deposited by thermal spraying and may comprise cubic yttria and monoclinic yttria. At least one of: (1) the ratio of the cubic yttria to monoclinic yttria, (2) the crystallite size of at least one of the cubic yttria or the monoclinic yttria, (3) the atomic ratio of oxygen (O) to yttria (Y), and/or (4) the dielectric properties of the poly-crystalline protective coating may be controlled to obtain consistent chamber performance when switching coated chamber components within a chamber of interest.

19 Claims, 8 Drawing Sheets

(51) Int. Cl.
*H01L 21/67* (2006.01)
*H01L 21/687* (2006.01)

(56) References Cited

U.S. PATENT DOCUMENTS

| | | |
|---|---|---|
| 4,399,199 A | 8/1983 | McGill et al. |
| 4,439,248 A | 3/1984 | Herchenroeder et al. |
| 4,642,440 A | 2/1987 | Schnackel et al. |
| 4,704,299 A | 11/1987 | Wielonski et al. |
| 4,880,614 A | 11/1989 | Strangman et al. |
| 5,381,944 A | 1/1995 | Makowiecki et al. |
| 5,415,756 A | 5/1995 | Wolfe et al. |
| 5,532,190 A | 7/1996 | Goodyear et al. |
| 5,626,923 A | 5/1997 | Fitzgibbons et al. |
| 5,631,803 A | 5/1997 | Cameron et al. |
| 5,687,679 A | 11/1997 | Mullin et al. |
| 5,766,693 A | 6/1998 | Rao |
| 5,800,871 A | 9/1998 | Collins et al. |
| 5,837,058 A | 11/1998 | Chen et al. |
| 5,853,815 A | 12/1998 | Muehlberger |
| 5,916,689 A | 6/1999 | Collins et al. |
| 5,939,219 A | 8/1999 | Jansing et al. |
| 6,106,959 A | 8/2000 | Vance et al. |
| 6,120,640 A | 9/2000 | Shih et al. |
| 6,194,083 B1 | 2/2001 | Yasuda et al. |
| 6,245,202 B1 | 6/2001 | Edamura et al. |
| 6,296,909 B1 | 10/2001 | Spitsberg et al. |
| 6,361,645 B1 | 3/2002 | Schoepp et al. |
| 6,506,254 B1 | 1/2003 | Bosch et al. |
| 6,530,990 B2 | 3/2003 | Kong et al. |
| 6,534,194 B2 | 3/2003 | Weihs et al. |
| 6,576,354 B2 | 6/2003 | Tsukatani et al. |
| 6,581,275 B2 | 6/2003 | Narendrnath et al. |
| 6,616,031 B2 | 9/2003 | Wong et al. |
| 6,783,875 B2 | 8/2004 | Yamada et al. |
| 6,794,059 B2 | 9/2004 | Shanker |
| 6,805,952 B2 | 10/2004 | Chang et al. |
| 6,933,254 B2 | 8/2005 | Morita et al. |
| 6,942,929 B2 | 9/2005 | Han et al. |
| 7,300,537 B2 | 11/2007 | O'Donnell et al. |
| 7,351,482 B2 | 4/2008 | Boutwell et al. |
| 7,441,688 B2 | 10/2008 | Van Heerden et al. |
| 7,507,268 B2 | 3/2009 | Rosenflanz |
| 7,510,641 B2 | 3/2009 | Kreiskott et al. |
| 7,615,133 B2 | 11/2009 | Tateno et al. |
| 7,648,782 B2 | 1/2010 | Kobayashi et al. |
| 7,649,729 B2 | 1/2010 | Buchberger, Jr. et al. |
| 7,670,688 B2 | 3/2010 | Kaushal et al. |
| 7,690,308 B2 | 4/2010 | Nielson et al. |
| 7,696,117 B2 | 4/2010 | Sun et al. |
| 7,810,704 B2 | 10/2010 | Duckham et al. |
| 7,897,268 B2 | 3/2011 | Iwasawa et al. |
| 7,964,517 B2 | 6/2011 | Jaiswal |
| 8,034,734 B2 | 10/2011 | Sun et al. |
| 8,206,829 B2 | 6/2012 | Sun et al. |
| 8,367,227 B2 | 2/2013 | Sun et al. |
| 8,404,572 B2 | 3/2013 | Chang et al. |
| 9,034,199 B2 | 5/2015 | Duan et al. |
| 9,090,046 B2 | 7/2015 | Sun et al. |
| 9,212,099 B2 | 12/2015 | Sun et al. |
| 2001/0003271 A1 | 6/2001 | Otsuki |
| 2001/0027159 A1 | 10/2001 | Kaneyoshi |
| 2002/0018902 A1 | 2/2002 | Tsukatani et al. |
| 2002/0018921 A1 | 2/2002 | Yamada et al. |
| 2002/0086119 A1 | 7/2002 | Hariharan et al. |
| 2002/0100424 A1 | 8/2002 | Sun et al. |
| 2003/0007308 A1 | 1/2003 | Harada et al. |
| 2003/0029563 A1 | 2/2003 | Kaushal et al. |
| 2003/0047802 A1 | 3/2003 | Hiramatsu et al. |
| 2003/0110708 A1 | 6/2003 | Rosenflanz |
| 2003/0159657 A1 | 8/2003 | Kaushal et al. |
| 2003/0185965 A1 | 10/2003 | Lin et al. |
| 2003/0232139 A1 | 12/2003 | DeTura |
| 2004/0009297 A1 | 1/2004 | Fusaro, Jr. et al. |
| 2004/0033385 A1 | 2/2004 | Kaushal et al. |
| 2004/0110016 A1 | 6/2004 | Hamaya et al. |
| 2004/0191545 A1 | 9/2004 | Han et al. |
| 2004/0229078 A1 | 11/2004 | Maeda |
| 2004/0266216 A1 | 12/2004 | Li et al. |
| 2005/0037193 A1 | 2/2005 | Sun et al. |
| 2005/0042876 A1 | 2/2005 | Kobayashi et al. |
| 2005/0056056 A1 | 3/2005 | Wong |
| 2005/0084654 A1 | 4/2005 | Takahashi et al. |
| 2005/0153069 A1 | 7/2005 | Tapphorn et al. |
| 2005/0164513 A1 | 7/2005 | DeOrnellas et al. |
| 2005/0227118 A1 | 10/2005 | Uchimaru et al. |
| 2005/0241148 A1 | 11/2005 | Vance |
| 2005/0266682 A1 | 12/2005 | Chen et al. |
| 2005/0271984 A1 | 12/2005 | Brueckner et al. |
| 2006/0068189 A1 | 3/2006 | Raybould et al. |
| 2006/0096703 A1 | 5/2006 | Moriya et al. |
| 2006/0164785 A1 | 7/2006 | Pellegrin |
| 2006/0178010 A1 | 8/2006 | Iwasawa et al. |
| 2006/0222777 A1 | 10/2006 | Skoog et al. |
| 2007/0006561 A1 | 1/2007 | Brady et al. |
| 2007/0110915 A1 | 5/2007 | Kitamura et al. |
| 2007/0169891 A1 | 7/2007 | Koshiishi et al. |
| 2007/0212567 A1 | 9/2007 | Esaki et al. |
| 2007/0218302 A1 | 9/2007 | Kobayashi et al. |
| 2008/0016684 A1 | 1/2008 | Olechnowicz et al. |
| 2008/0029032 A1 | 2/2008 | Sun et al. |
| 2008/0090034 A1 | 4/2008 | Harrison et al. |
| 2008/0099148 A1 | 5/2008 | Ryabova et al. |
| 2008/0108225 A1 | 5/2008 | Sun et al. |
| 2008/0113218 A1 | 5/2008 | Schlichting et al. |
| 2008/0151467 A1 | 6/2008 | Simpson |
| 2008/0169588 A1 | 7/2008 | Shih et al. |
| 2008/0174930 A1 | 7/2008 | Hattori et al. |
| 2008/0213496 A1 | 9/2008 | Sun et al. |
| 2008/0223725 A1 | 9/2008 | Han et al. |
| 2008/0241412 A1 | 10/2008 | Inaki et al. |
| 2008/0261800 A1 | 10/2008 | Yuan et al. |
| 2008/0264564 A1 | 10/2008 | Sun et al. |
| 2008/0264565 A1 | 10/2008 | Sun et al. |
| 2008/0268171 A1 | 10/2008 | Ma et al. |
| 2008/0268645 A1 | 10/2008 | Kao et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0075486 A1 | 3/2009 | Kikuyama et al. |
| 2009/0133713 A1 | 5/2009 | Ohmi et al. |
| 2009/0142588 A1 | 6/2009 | Ohmi et al. |
| 2009/0214825 A1 | 8/2009 | Sun et al. |
| 2009/0252945 A1 | 10/2009 | Refke et al. |
| 2009/0284894 A1 | 11/2009 | Cooke |
| 2009/0297718 A1 | 12/2009 | Sarrafi-Nour et al. |
| 2010/0048379 A1 | 2/2010 | Thippareddy et al. |
| 2010/0053841 A1 | 3/2010 | Rusinko, Jr. et al. |
| 2010/0112192 A1 | 5/2010 | Li et al. |
| 2010/0115961 A1 | 5/2010 | Chapman et al. |
| 2010/0119843 A1 | 5/2010 | Sun et al. |
| 2010/0129670 A1 | 5/2010 | Sun et al. |
| 2010/0160143 A1 | 6/2010 | Sun et al. |
| 2010/0177454 A1 | 7/2010 | Elliot et al. |
| 2010/0218472 A1 | 9/2010 | Iyer |
| 2010/0272982 A1 | 10/2010 | Dickinson et al. |
| 2010/0314356 A1 | 12/2010 | Nagayama et al. |
| 2011/0049729 A1 | 3/2011 | Naundorf et al. |
| 2011/0081782 A1 | 4/2011 | Liang et al. |
| 2011/0086178 A1 | 4/2011 | Ruud et al. |
| 2011/0135915 A1 | 6/2011 | Lee et al. |
| 2011/0149462 A1 | 6/2011 | Kugimoto et al. |
| 2011/0151237 A1 | 6/2011 | Nakano et al. |
| 2011/0174441 A1 | 7/2011 | Yamashita et al. |
| 2011/0198034 A1 | 8/2011 | Sun et al. |
| 2011/0268877 A1 | 11/2011 | Dickson et al. |
| 2011/0268956 A1 | 11/2011 | Fagoaga Altuna et al. |
| 2011/0315081 A1 | 12/2011 | Law et al. |
| 2012/0034469 A1 | 2/2012 | Sun et al. |
| 2012/0040100 A1 | 2/2012 | Matias et al. |
| 2012/0076574 A1 | 3/2012 | Parkhe |
| 2012/0100299 A1 | 4/2012 | Zajchowski et al. |
| 2012/0100300 A1 | 4/2012 | Gindrat et al. |

(56) References Cited

U.S. PATENT DOCUMENTS

| | | | |
|---|---|---|---|
| 2012/0104703 A1 | 5/2012 | Sun et al. |
| 2012/0125488 A1 | 5/2012 | Sun et al. |
| 2012/0132106 A1 | 5/2012 | Damani et al. |
| 2012/0141661 A1 | 6/2012 | Cho et al. |
| 2012/0144640 A1 | 6/2012 | Shih et al. |
| 2012/0196139 A1 | 8/2012 | Petorak et al. |
| 2012/0299253 A1 | 11/2012 | Kosakai et al. |
| 2012/0307412 A1 | 12/2012 | Boyd, Jr. et al. |
| 2013/0019797 A1 | 1/2013 | Tanaka et al. |
| 2013/0023401 A1 | 1/2013 | Watanabe et al. |
| 2013/0026720 A1 | 1/2013 | Hori et al. |
| 2013/0048606 A1 | 2/2013 | Mao et al. |
| 2013/0095340 A1 | 4/2013 | Sivakumar et al. |
| 2013/0130052 A1 | 5/2013 | Menuey et al. |
| 2013/0174983 A1 | 7/2013 | Kikuchi et al. |
| 2013/0216783 A1 | 8/2013 | Duan et al. |
| 2013/0216821 A1 | 8/2013 | Sun et al. |
| 2013/0224498 A1 | 8/2013 | Sun et al. |
| 2013/0224675 A1 | 8/2013 | Park |
| 2013/0251949 A1* | 9/2013 | Sato ............... H01L 21/3065 428/148 |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2014/0030486 A1 | 1/2014 | Sun et al. |
| 2014/0030533 A1 | 1/2014 | Sun et al. |
| 2014/0031533 A1 | 1/2014 | Liu et al. |
| 2014/0099491 A1 | 4/2014 | Ameen et al. |
| 2014/0349073 A1 | 11/2014 | Sun et al. |
| 2014/0360407 A1 | 12/2014 | Kitamura et al. |
| 2014/0363596 A1 | 12/2014 | Sun et al. |
| 2014/0377504 A1 | 12/2014 | Sun et al. |
| 2015/0021324 A1 | 1/2015 | Sun et al. |
| 2015/0024155 A1 | 1/2015 | Sun et al. |
| 2015/0075714 A1 | 3/2015 | Sun et al. |
| 2015/0079370 A1 | 3/2015 | Sun et al. |
| 2015/0133285 A1 | 5/2015 | Sun et al. |
| 2015/0158775 A1 | 6/2015 | Sun et al. |
| 2015/0218057 A1 | 8/2015 | Duan et al. |
| 2015/0270108 A1 | 9/2015 | Sun et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329430 A1 | 11/2015 | Sun et al. |
| 2015/0329955 A1 | 11/2015 | Sun et al. |
| 2017/0152189 A1* | 6/2017 | Iwasawa ............ C04B 41/5045 |

FOREIGN PATENT DOCUMENTS

| | | |
|---|---|---|
| EP | 0330196 B1 | 8/1989 |
| JP | 2002-087878 A1 | 3/2002 |
| JP | 2005-279481 A1 | 10/2005 |
| JP | 2006-089338 A1 | 4/2006 |
| JP | 2006-207012 A1 | 8/2006 |
| JP | 2007-138288 A1 | 6/2007 |
| JP | 2007-191794 A1 | 8/2007 |
| JP | 2009-536732 A1 | 10/2009 |
| JP | 2010-106327 A1 | 5/2010 |
| JP | 2010-229492 A1 | 10/2010 |
| JP | 2013-124378 A1 | 6/2013 |
| JP | 2016-008352 A1 | 1/2016 |
| JP | 5987097 B2 | 9/2016 |
| KR | 10-2003-0025007 | 3/2003 |
| KR | 10-2007-0013118 | 1/2007 |
| KR | 10-2011-0028378 | 3/2011 |
| KR | 10-2011-0117845 | 10/2011 |
| KR | 10-1108692 B1 | 1/2012 |
| WO | 2001/024581 A1 | 4/2001 |
| WO | 2002/000968 A1 | 1/2002 |
| WO | 2003/100843 A2 | 12/2003 |
| WO | 2012/033326 A2 | 3/2012 |
| WO | 2013-052966 A1 | 4/2013 |
| WO | 2013/176168 A1 | 11/2013 |

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereol 2011;30:53-62, Published Jan. 27, 2011.

Smith et al., "Very Low Pressure Plasma Spray—A Review of an Emerging Technology in the Thermal Spray Community," Coatings 2011, 1, 117-132, doi: 10.3390/coatings1020117, Published Dec. 20, 2011.

Zircotec—Plasma sprayed ceramic thermal coatings, http://www.zircotec.com/page/plasma-spray-processing/39, downloaded Apr. 4, 2014.

Nakamura et al., "Effects of Pores on Mechanical Properties of Plasma-Sprayed Ceramic Coatings," J. Am. Ceram. Soc., 83 [3] 578-84, Mar. 2000.

Govindarajan et al., "In situ Particle Generation and Splat Formation During Solution Precursor Plasma Spraying of Yttria-Stabilized Zirconia Coatings," J Am. Ceram. Soc., 1-9 (2011).

"Thermal Spraying," definition, Wikipedia, http://en.wikipedia.org/wiki/Thermal_spraying, downloaded Apr. 14, 2014.

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

Refke, et al "LPPS thin film technology for the application of TBC systems", International Thermal Spray Conference, Basel Switzerland, May 2-4, 2005, 6 pages.

Gidrat, et al. "Plasma Spray-CVD: A New Thermal Spray Process to Produce Thin Films from Liquid of Gaseous Precursors", Journal of Thermal Spray Technology, Jun. 2011, pp. 882-887, vol. 20(4).

Sulzer Metco, "Solutions Flash, ChamPro™ LPPS™ Hybrid Technologies for Application of Unique, High-Performance Functional Surfaces", Jul. 2012, SF-0014.1, 12 pages.

Srinivasan, Vasudevan, "A Critical Assessment of In-Flight Particle State During Plasma Spraying of YSZ and its Implications on Coating Properties and Process Reliability", Dissertation presented to Stony Brook University, Aug. 2007, ProQuest LLC, Ann Arbor, MI.

Francis, John S.C. et al., "Fiash-Sinterforging of Nanograin Zirconia; Field Assisted Sintering and Superplasticity", Jan. 2012, Journal of the American Ceramic Society, pp. 138-146, vol. 95, No. 1.

Yoshida, Hidehiro et al., "Densification Behaviour and Microstructural Development in Undoped Yttria Prepared by Flash-Sintering", Nov. 27, 2013, Journal of the European Ceramic Society, vol. 34, Issue 4, Apr. 2014, ISSN 0955-2219, pp. 991-1000.

Cologna, Marco et al., "Flash Sintering of Nanograin Zirconia in <5 s at 850 degrees C", Nov. 2010, Rapid Communications of the American Ceramic Society, pp. 3556-3559, vol. 93, No. 11.

* cited by examiner

US 11,047,035 B2

PROTECTIVE YTTRIA COATING FOR SEMICONDUCTOR EQUIPMENT PARTS

RELATED APPLICATIONS

This patent application claims the benefit under 35 U.S.C. § 119(e) of U.S. Provisional Application No. 62/634,235, filed Feb. 23, 2018.

TECHNICAL FIELD

Embodiments disclosed herein relate, in general, to protective coatings for semiconductor equipment parts, and in particular to protective yttria coatings that provide for consistent process performance.

BACKGROUND

Semiconductor processing equipment remove or etch silicon or other semiconductor layers with high level of precision, creating semiconductor structures of ever decreasing sizes, enabling the extension of Moore's law and the Information Age. Chamber parts of such processing equipment are typically coated with a protective coating due to their exposure to highly reactive processing environments. The protective coatings improve the processing lifetime of the chamber parts and enhance process control and stability over a larger number of processed wafer.

Protective coatings from different vendors often yield coated chamber components with varying process performance. Identifying parameters of the protective coating that could yield coated chamber components with consistent process performance could provide consistent performance on billions of products that include processed wafers. Consistent process performance could also lower the cost per wafer, improve processing lifetime of the coated chamber parts and further enhance the process control and stability over a consistently larger number of processed wafer.

SUMMARY

In an example embodiment, disclosed herein is a method comprising thermal spraying a poly-crystalline protective coating on a surface of a chamber component. In some embodiments, the poly-crystalline protective coating may comprise cubic yttria and monoclinic yttria. In some embodiments, the ratio of cubic yttria to monoclinic yttria in the poly-crystalline protective coating may range between about 1:1 and about 9:1. In some embodiments, one or more of the cubic yttria or the monoclinic yttria may have a crystallite size of up to about 54 nm.

In an example embodiment, disclosed herein is a coated chamber component. In some embodiments, the coated chamber component may comprise a chamber component and a poly-crystalline protective coating. In some embodiments, the poly-crystalline protective coating may be formed by thermal spray at a surface of the chamber component. In some embodiments, the poly-crystalline protective coating may comprise cubic yttria and monoclinic yttria. In some embodiments, the ratio of cubic yttria to monoclinic yttria in the poly-crystalline protective coating may range between about 1:1 and about 9:1. In some embodiments, one or more of the cubic yttria or the monoclinic yttria may have a crystallite size of up to about 54 nm.

In an example embodiment, disclosed herein is a poly-crystalline protective coating. In some embodiments, the poly-crystalline protective coating may be formed by thermal spray. In some embodiments, the poly-crystalline protective coating may comprise cubic yttria and monoclinic yttria. In some embodiments, the ratio of cubic yttria to monoclinic yttria in the poly-crystalline protective coating may range between about 1:1 and about 9:1. In some embodiments, one or more of the cubic yttria or the monoclinic yttria may have a crystallite size of up to about 54 nm. In some embodiments, the ratio (O/Y) of an atomic concentration of oxygen (O) to an atomic concentration of yttrium (Y) in the poly-crystalline protective coating ranges between 1.4 and 1.6.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
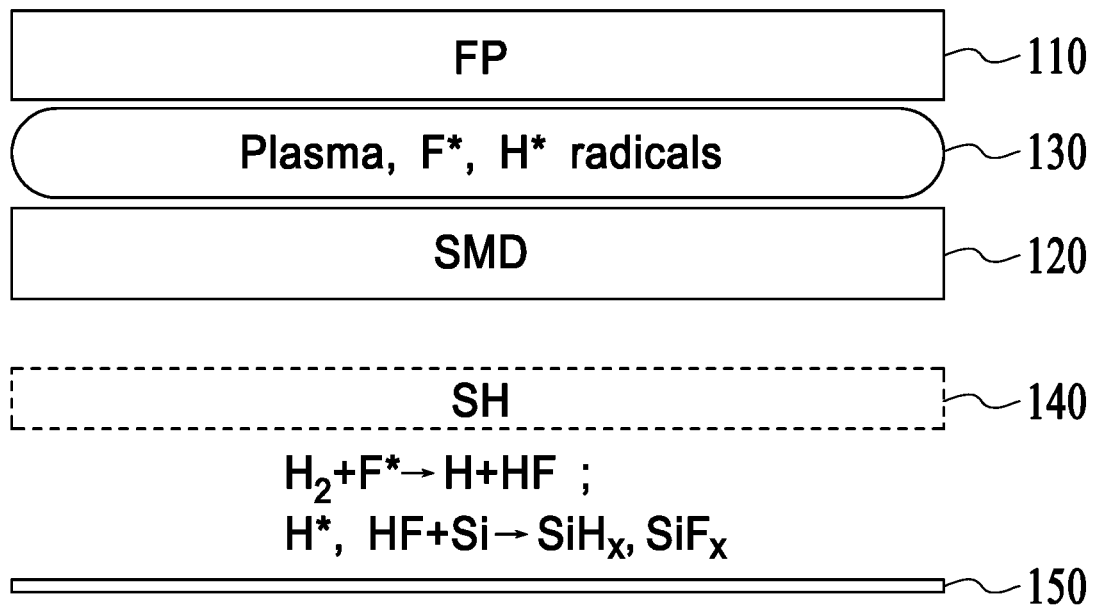
FIG. 1 is a sectional view of certain parts that may be coated with a poly-crystalline protective coating, in accordance with an embodiment, in an exemplary selective etch chamber.

Protective coatings of rare earth oxides like yttria (also referred to as "yttrium oxide" or "$Y_2O_3$") are generally inert. Nevertheless, their interaction with reactive plasma environments that process wafers such as semiconductor wafers may be affected by key parameters that affect an ability to achieve repeatable wafer level process control within targeted specifications.

These key parameters include the ratio of cubic to monoclinic crystalline phases, crystallite size of at least one of the cubic or of the monoclinic crystalline phase of a rare earth oxide (such as yttrium oxide), and dielectric properties of the rare earth oxide coating (such as layer capacitance and loss tangent).

Controlling the above listed parameters affects the relative concentration of reactive species such as hydrogen and fluorine radicals in a chamber's processing environment. The concentration of such reactive species affects an ability to achieve consistent targeted wafer level parameters (such as etch amount), which are useful for obtaining consistent and repeatable process performance in semiconductor processing equipment.

The coatings discussed herein may be coated by thermal spraying (such as plasma-spray) at temperatures that can heat up precursor powders of rare earth oxides (such as yttria) to near their melting point (e.g., 2425° C.) for deposition as coatings on cooler substrates that may be maintained at below 500° C. (such as aluminum or other metals).

Dielectric and poly-crystalline structure properties of the coating material may be controlled through the thermal spraying process by adjusting parameters, such as the temperature profile, the type of gases, the power, the powder size and type, the gun type, the gas flow rates, the torch standoff distance, etc.

In embodiments, the disclosure may be directed to a coated chamber component. The coated chamber component may comprise a chamber component and a poly-crystalline protective coating. The poly-crystalline protective coating may be formed by thermal spraying at the surface of the chamber component. The poly-crystalline protective coating may comprise cubic yttria and monoclinic yttria. The ratio of cubic yttria to monoclinic yttria in the poly-crystalline protective coating may range between about 1:1 and about 9:1. At least one of cubic yttria or the monoclinic yttria may have a crystallite size of up to 54 nm. Poly-crystalline protective coatings having the above listed parameters affect the relative concentration of reactive species such as hydrogen and fluorine radicals in a chamber's processing environment. The concentration of such reactive species affects an ability to achieve consistent targeted wafer level parameters (such as etch amount), which are useful for obtaining consistent and repeatable process performance in semiconductor processing equipment.

When the terms "about" and "approximate" are used herein, this is intended to mean that the nominal value presented is precise within ±10%.

When the term "poly-crystalline" is used herein in context with the coating, it refers to a coating that comprises more than one crystalline phase.

FIG. 1 is a sectional view of certain chamber component parts that may be coated with a poly-crystalline protective coating, in accordance with an embodiment. Exemplary chambers where a poly-crystalline protective coating as described herein may be used comprise a selective etch chamber. It should be understood that poly-crystalline protective coatings as described herein may be used in various chambers and not only in selective etch chambers. The term "selective etch chamber" refers to semiconductor processing equipment that removes or etches silicon or other semiconductor layers with a high level of precision, creating semiconductor structures below 10 nm with high aspect ratios (e.g., aspect ratios of 10:1 to 300:1), such as Applied Material's Selectra™. Other chambers, such as deposition chambers, may also benefit from the poly-crystalline protective coating as described herein.

Exemplary non limiting chamber components that may be coated with a poly-crystalline protective coating as described herein may be selected from the group consisting of an electrostatic chuck, a nozzle, a gas distribution plate, a showerhead, an electrostatic chuck component, a chamber wall, a liner, a liner kit, a gas line, a lid, a chamber lid, a nozzle, a single ring, a processing kit ring, a base, a shield, a plasma screen, a flow equalizer, a cooling base, a chamber viewport, a bellow, a faceplate, selectivity modulating device, and so on.

A selective etch chamber may comprise two electrodes, electrode 110 and electrode 120. Electrode 110 may be referred to as a faceplate (FP) electrode. Electrode 120 may be referred to as selectivity modulating device (SMD) electrode. Capacitive plasma 130 may be created between FP 110 and SMD 120. The plasma 130 may contain many ions, such as fluorine and hydrogen ions. These ions may be streamed to SMD 120. The ions may be held in SMD 120 and then may pass through showerhead (SH) 140 and may be streamed to a wafer 150 (e.g. a silicon wafer) where the ions may be no longer ionized. In embodiments, the SMD 120 neutralizes the fluorine and hydrogen ions and converts them into fluorine and hydrogen atoms. The reactive fluorine and hydrogen atoms hit the surface of wafer 150 and react with the surface. For instance, when wafer 150 is a silicon wafer, exemplary reactions between the neutralized hydrogen and fluorine atoms and the silicon wafer surface may comprise:

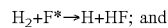

$H_2 + F^* \rightarrow H + HF$; and

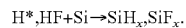

$H^*, HF + Si \rightarrow SiH_x, SiF_x$.

Such reactions may yield volatile reaction products (e.g., $SiH_x$ and $SiF_x$) which may evaporate, leaving wafer 150 etched.

In some instances, some of the radicals, before passing through their intended route and reaching the wafer, may get lost to the chamber components, e.g., to FP 110, to SMD 120, or to SH 130. In other instances, some of the radicals may react with chamber components, also referred to as "re-combination." The losses diminish the amount of radicals that reach wafer 150 and may lower the etch amount. The term "etch amount" refers to the amount of material removed from a wafer during processing.

One non-limiting theory is that the radical losses and the etch amount may be controlled by controlling the poly-crystalline protective coating and/or the method of depositing a poly-crystalline protective coating onto a surface of a chamber component. In particular, the radical losses and the etch amount may be controlled by the ratio of cubic yttria to monoclinic yttria, the crystallite size of at least one of the cubic yttria or the monoclinic yttria, the atomic ratio (O/Y) of oxygen atoms (0) to yttrium atoms (Y), and/or. Another non-limiting theory is that production of radicals which drive etch amount may be controlled by the efficiency of RF (radio frequency) power coupling to the processing plasma. It is believed that the efficiency of the RF power coupling to the plasma may be controlled by the dielectric properties (such as loss tangent—dissipation factor and impedance) of the poly-crystalline protective coating.

Figure 2:
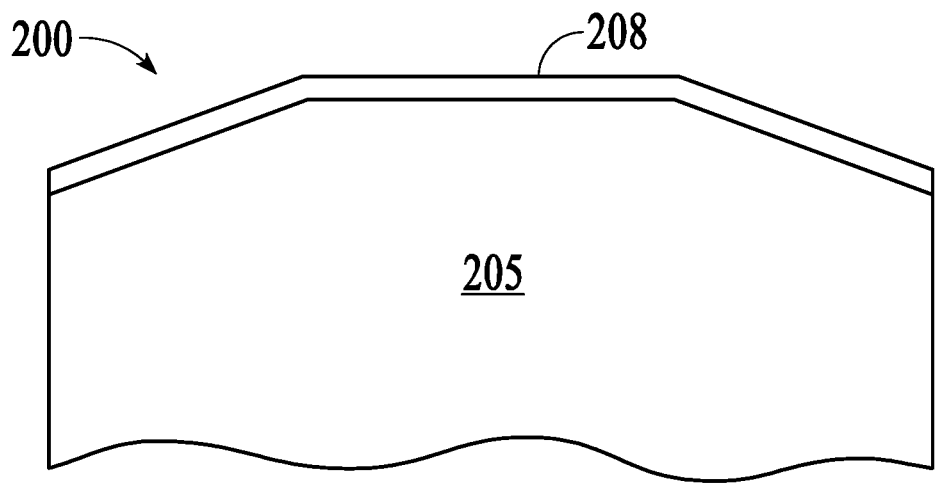
FIG. 2 depicts a sectional view of an exemplary chamber component with a poly-crystalline protective coating, according to an embodiment.

FIG. 2 depicts a sectional view of an exemplary chamber component with a poly-crystalline protective coating, according to an embodiment. FIG. 2 depicts a coated chamber component 200 comprising a chamber component 205 and a poly-crystalline protective coating 208 coated on a surface of chamber component 205, in accordance with an embodiment. Chamber component 205 may be made from a metal (such as aluminum, stainless steel), a ceramic, a metal-ceramic composite, a polymer, a polymer ceramic composite, or other suitable materials. Exemplary ceramic articles include an oxide based ceramic article, a nitride based ceramic article, and/or carbide based ceramic article.

Examples of oxide based ceramics include $SiO_2$ (quartz), $Al_2O_3$, $Y_2O_3$, and so on. Examples of carbide based ceramics include SiC, Si—SiC, and so on. Examples of nitride based ceramics include AN, SiN, and so on. In some embodiments, article 205 may be aluminum, anodized aluminum, an aluminum alloy (e.g., Al 6061), or an anodized aluminum alloy.

The poly-crystalline protective coating 208 may comprise a ceramic material. The ceramic material may comprise a rare earth oxide, a rare earth fluoride, a rare earth oxyfluoride or other ceramic material. In certain embodiments, the ceramic material comprises yttrium oxide ($Y_xO_y$). In certain embodiments, the ceramic material may comprise yttrium comprise yttrium oxide and added or residual fluorine. In some embodiments, the ceramic material may comprise yttrium oxyfluoride (Y—O—F).

Any of the aforementioned ceramic materials may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. The ceramic materials allow for longer working lifetimes due to the plasma resistance of the ceramic materials and decreased on-wafer or substrate contamination. Beneficially, in some embodiments the ceramic material may be stripped and re-coated without affecting the dimensions of the chamber components that are coated.

Figure 7A:
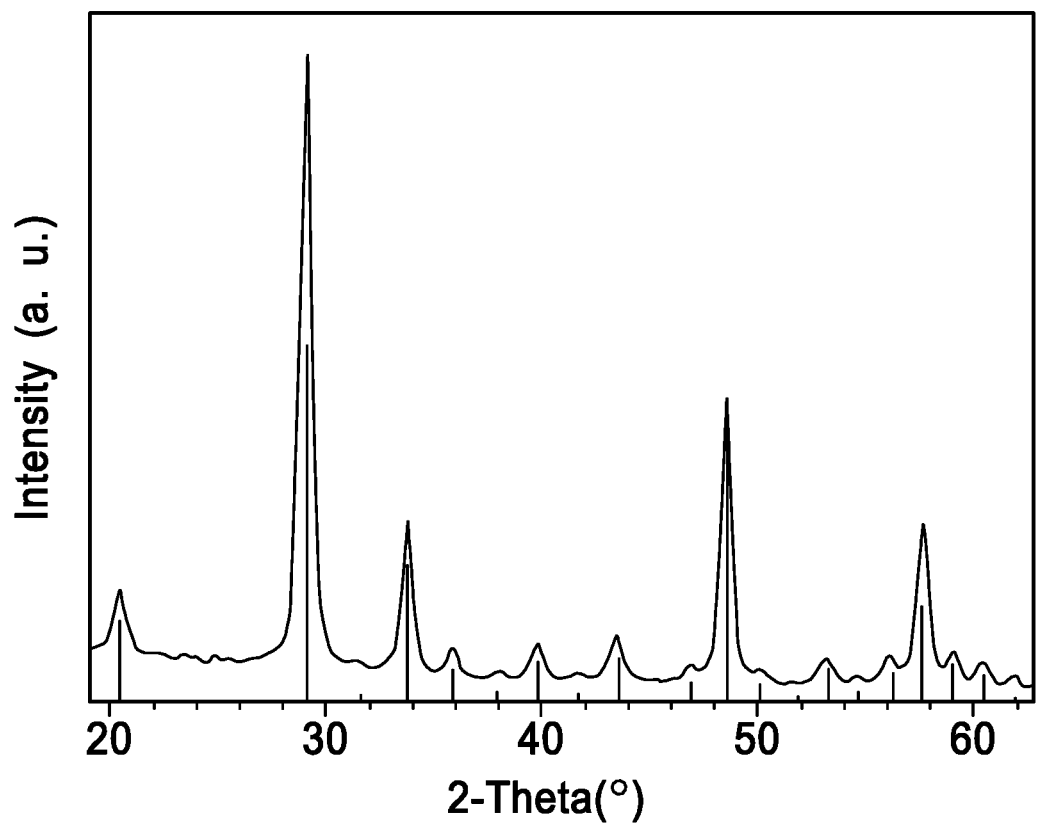
FIG. 7A illustrates an X-Ray Diffraction (XRD) pattern for yttria in a cubic phase.
Figure 7B:
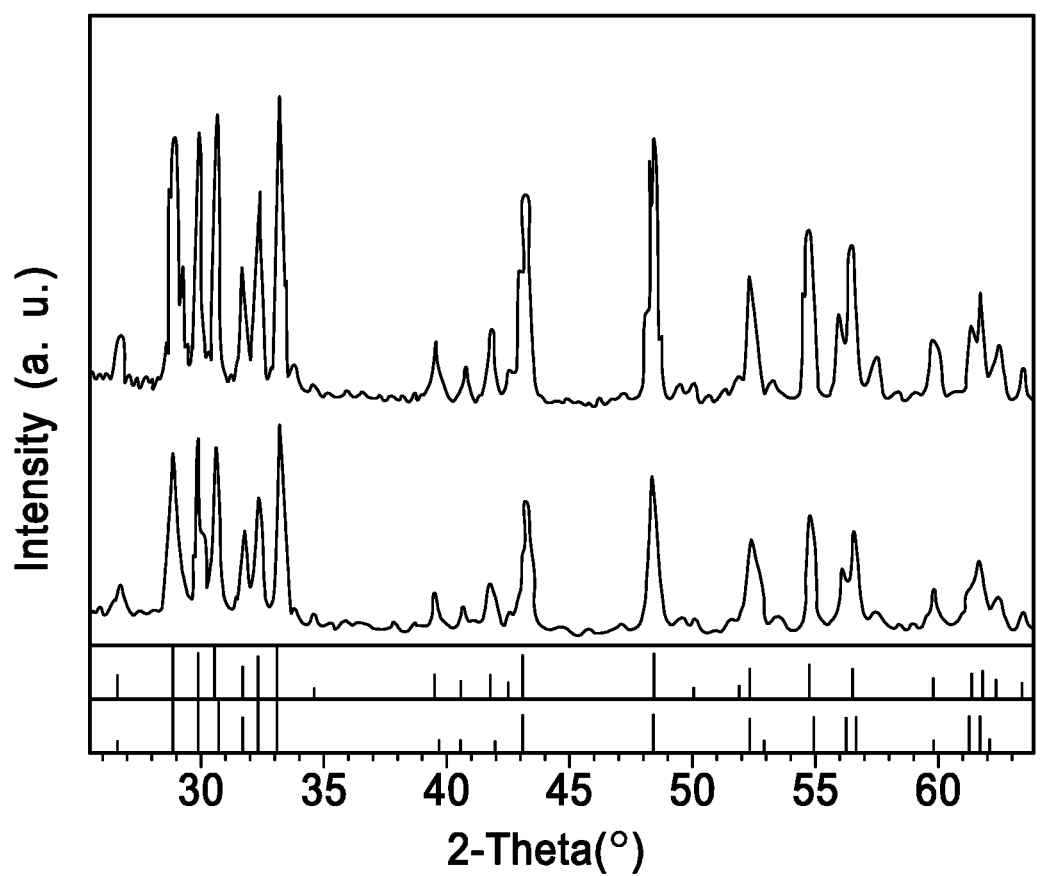
FIG. 7B illustrates an XRD pattern for two samples of yttria in a monoclinic phase.

In one embodiment, poly-crystalline protective coating 208 may comprise yttria. In some embodiments, poly-crystalline protective coating 208 may comprise cubic yttria and monoclinic yttria. The term "cubic yttria" refers to yttria having an X-Ray Diffraction (XRD) pattern as illustrated in FIG. 7A. The term "monoclinic yttria" refers to yttria having an XRD as illustrated in FIG. 7B.

In some embodiments, the optimal ratio of cubic yttria to monoclinic yttria in the poly-crystalline protective coating ranges between about 1:1 to about 9:1, between about 2:1 to about 6:1, or between about 3:1 to about 5.5:1.

In some embodiments, at least one of the cubic yttria or the monoclinic yttria have a crystallite size of up to about 54 nm, up to about 50 nm, up to about 40 nm, or up to about 35 nm.

It has been identified, as explained in detail below with respect to Table 1, that larger crystallite size for the at least one of the cubic yttria or the monoclinic yttria, or a ratio of cubic yttria to monoclinic yttria that is too low or too high (i.e. outside of the above listed ranges) may result in a lower etch amount and a greater absolute value of the percent etch amount drop.

Without being bound by theory, it is believed that too much of the monoclinic phase versus the cubic phase may be a type of a loss mechanism. Excess crystallites in the monoclinic phase may provide more surface area that could promote more re-combinations of fluorine and hydrogen radicals leading to greater losses of these reactive species. It is also believed that excess crystallites in the cubic phase may produce valleys that could promote more re-combinations of fluorine and hydrogen radicals. It should be understood by one of ordinary skill in the art that these theories should not be construed as limiting.

Figure 8A:
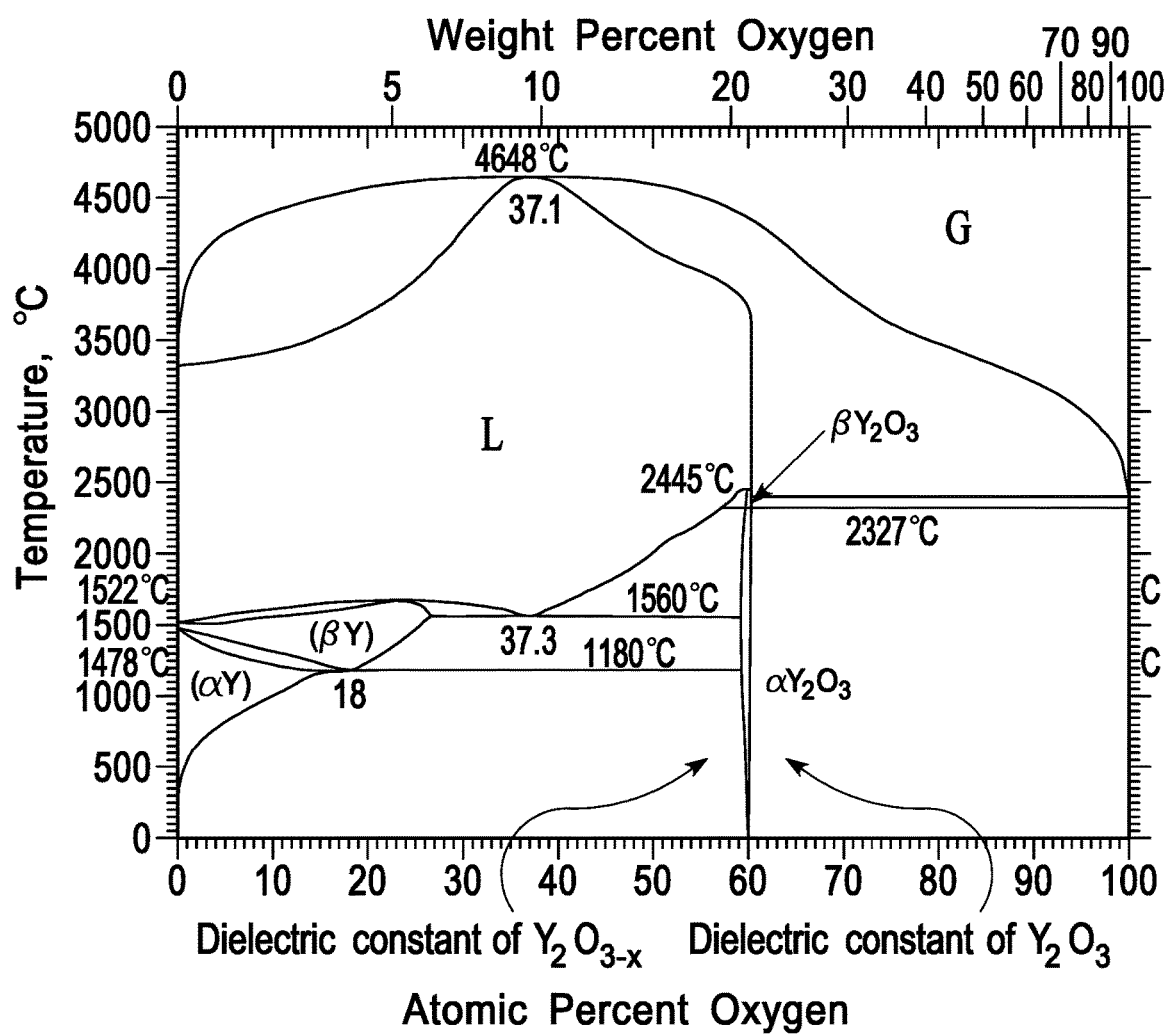
FIG. 8A depicts a phase diagram of yttrium oxide as a function of the atomic percent of oxygen and as a function of temperature.
Figure 8B:
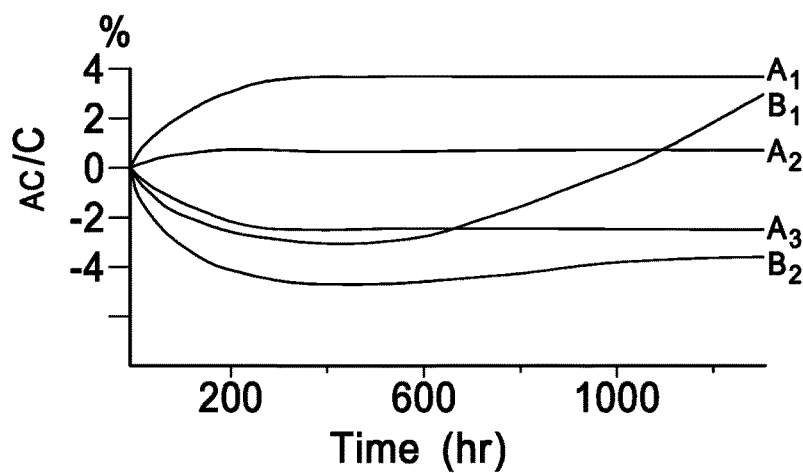
FIG. 8B depicts capacitance as a function of time for an yttria film capacitor protected with an insulator and unprotected.

In some embodiments, the ratio (O/Y) of an atomic concentration of oxygen (O) to an atomic concentration of yttrium (Y) in the poly-crystalline protective coating ranges between 1.4 and 1.6. One non-limiting theory is that the proportion of oxygen to yttrium in the yttrium-oxygen phase diagram of FIG. 8A affects the dielectric properties of the yttria coating. Exemplary dielectric properties that may get affected include layer capacitance, impedance and loss tangent or dissipation factor. This mechanism is believed to be through the presence or density of oxygen vacancies. For instance, beneficial capacitors are close to $Y_2O_3$, i.e. to an atomic oxygen to yttrium value of about 1.4-1.6, or about 1.5. In comparison, $Y_2O_3$, capacitors, i.e. capacitors with an atomic oxygen to yttrium value lower than 1.4, might have leakage through the oxygen vacancies. In FIG. 8A, the dielectric constant of $Y_2O_3$, is lower than the dielectric constant of $Y_2O_3$. In embodiments, the capacitance of the yttria coating is maximized and the bulk resistance or the loss tangent of the yttria coating is minimized. Minimizing the loss tangent may in turn maximize the RF (Radio Frequency) power coupling efficiency, particularly in a capacitively coupled plasma (CCP) processing chamber as shown in FIG. 8B.

Poly-crystalline protective coating 208 may have a thickness of about 50 nm to about 1 mm, about 10 nm to about 100 nm, about 20 nm to about 50 nm, about 200 nm to about 500 nm, or about 300 nm to about 400 nm.

In certain embodiments, poly-crystalline protective coating 208 may be formed by thermal spray. Thermal sprayed coatings may have a porosity of about 1% to about 10%, about 2% to about 5%, or about 2% to about 3%. Exemplary physical vapor deposition and thermal spraying technologies may include, without limitations, plasma spraying, vacuum evaporation, detonation spraying, wire arc spraying, flame spraying, high velocity oxy-fuel coating spraying (HVOF), high velocity air fuel (HVAF), warm spraying, and cold spraying.

In some embodiments, a method of coating a chamber component comprises thermal spraying a poly-crystalline protective coating on a surface of a chamber component. An exemplary thermal spraying technique may be plasma spraying in one embodiment.

Figure 3:
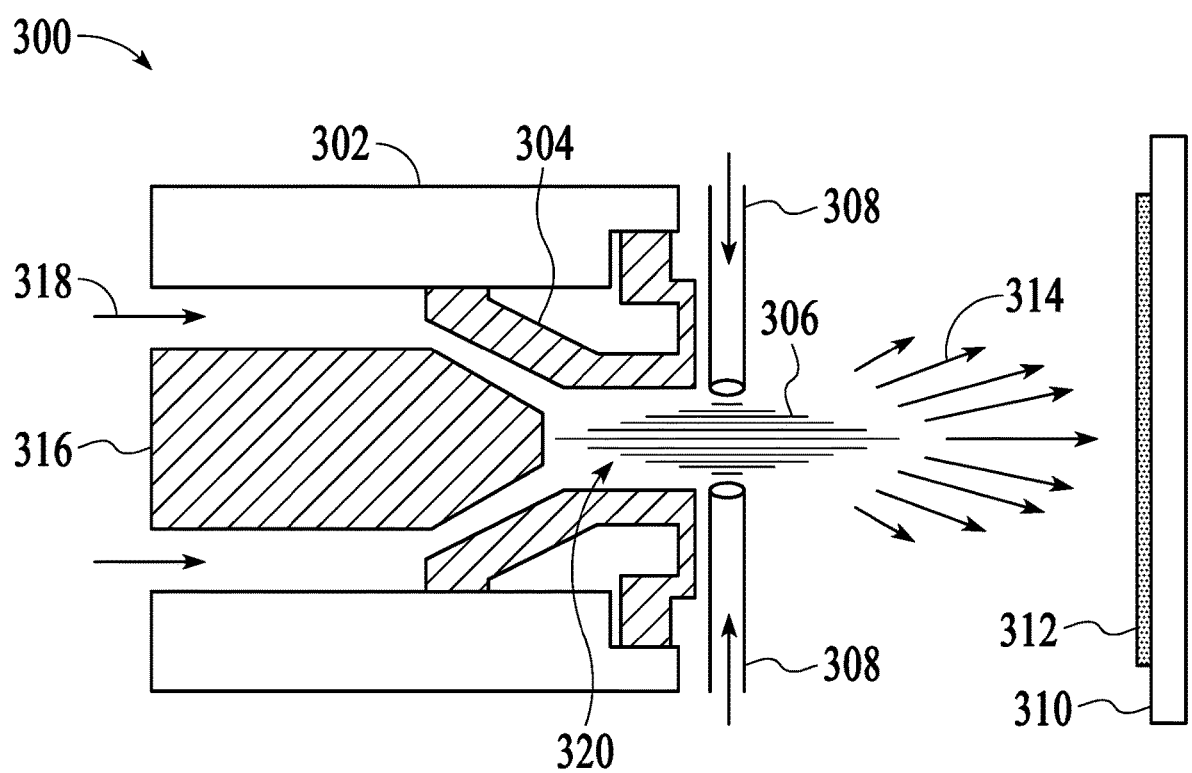
FIG. 3 illustrates a cross-sectional view of a system for plasma spraying a poly-crystalline protective coating on a chamber component according to an embodiment.

FIG. 3 illustrates a cross-sectional view of a system 300 for plasma spraying a poly-crystalline protective coating on a chamber component according to an embodiment. The system 300 is a type of thermal spray system. In a plasma spray system 300, an arc 306 is formed between two electrodes, an anode 304 and a cathode 316, through which a plasma gas 318 is flowing via a gas delivery tube 302. The plasma gas 318 may be a mixture of two or more gases. Examples of gas mixtures suitable for use in the plasma spray system 300 include, but are not limited to, argon/hydrogen, argon/helium, nitrogen/hydrogen, nitrogen/helium, or argon/oxygen. The first gas (gas before the forward-slash) represents a primary gas and the second gas (gas after the forward-slash) represents a secondary gas. A gas flow rate of the primary gas may differ from a gas flow rate of the secondary gas. In one embodiment, a gas flow rate for the primary gas is about 30 L/min and about 400 L/min. In one embodiment, a gas flow rate for the secondary gas is between about 3 L/min and about 100 L/min.

As the plasma gas is ionized and heated by the arc 306, the gas expands and is accelerated through a shaped nozzle 320, creating a high velocity plasma stream.

Powder 308 is injected into the plasma spray or torch (e.g., by a powder propellant gas) where the intense temperature melts the powder and propels the material as a stream of molten particles 314 towards the chamber component 310. Upon impacting the surface of the chamber component 310, the molten powder flattens, rapidly solidifies, and forms a poly-crystalline protective coating 312, which adheres to the surface of chamber component 310. The parameters that affect the thickness, density, porosity, and roughness of the poly-crystalline protective coating 312 include type of powder, powder size distribution, powder feed rate, plasma gas composition, plasma gas flow rate, energy input (power), torch offset distance, substrate cooling, gun type, etc. These parameters may also control the final dielectric properties and crystallite structure of poly-crystalline protective coating 312.

For instance, the temperature should be sufficiently high to adequately melt the spray powder particles. Ensuring that the temperature is sufficiently high may include providing enough electrical power to the spray gun to energize the plasma arc which melts the powder and heats the accompanying gas flow.

Similarly, the type of plasma gas and flow rate of the appropriate gases should be such that the gases are present in adequate proportion to ensure that there is enough heat capacity to maintain the temperature profile next to the surface to be coated. Appropriate gases may include diatomic gases (such as oxygen, nitrogen, hydrogen). The gases, particularly oxygen, should be available at or above ambient proportion (of about 20%) to ensure that the rare earth oxide (such as yttrium oxide) re-absorbs oxygen to reduce or eliminate oxygen vacancies in the final rare earth oxide coating in order to achieve a target crystallite structure and target dielectric properties.

Plasma spray apparatus 300 may be used to form a poly-crystalline protective coating comprising yttria in embodiments. Poly-crystalline protective coating 312 may comprise a cubic yttria and a monoclinic yttria. The ratio of cubic yttria to monoclinic yttria in the poly-crystalline protective coating deposited by a thermal spray technique (e.g., plasma spray) may range between about 1:1 to about 9:1, between about 2:1 to about 6:1, or between about 3:1 to about 5.5:1. The crystallite size of the at least one of the cubic yttria or the monoclinic yttria in poly-crystalline protective coatings deposited by a thermal spray technique (e.g., plasma spray) may be up to about 54 nm, up to about 50 nm, up to about 40 nm, or up to about 35 nm. The ratio (O/Y) of an atomic concentration of oxygen (O) to an atomic concentration of yttrium (Y) in poly-crystalline protective coating deposited by a thermal spray technique (e.g., plasma spray) may range between 1.4 and 1.6.

In some embodiments, the method of coating a chamber component with a poly-crystalline protective coating may further comprise forming one or more features in the poly-crystalline protective coating. Forming one or more features may include grinding and/or polishing the poly-crystalline protective coating, drilling holes in the poly-crystalline protective coating, cutting and/or shaping the poly-crystalline protective coating, roughening the poly-crystalline protective coating (e.g., by bead blasting), forming mesas on the poly-crystalline protective coating, and so forth. In one embodiment, the one or more features may comprise at least one of holes, channels, or mesas.

Figure 4:
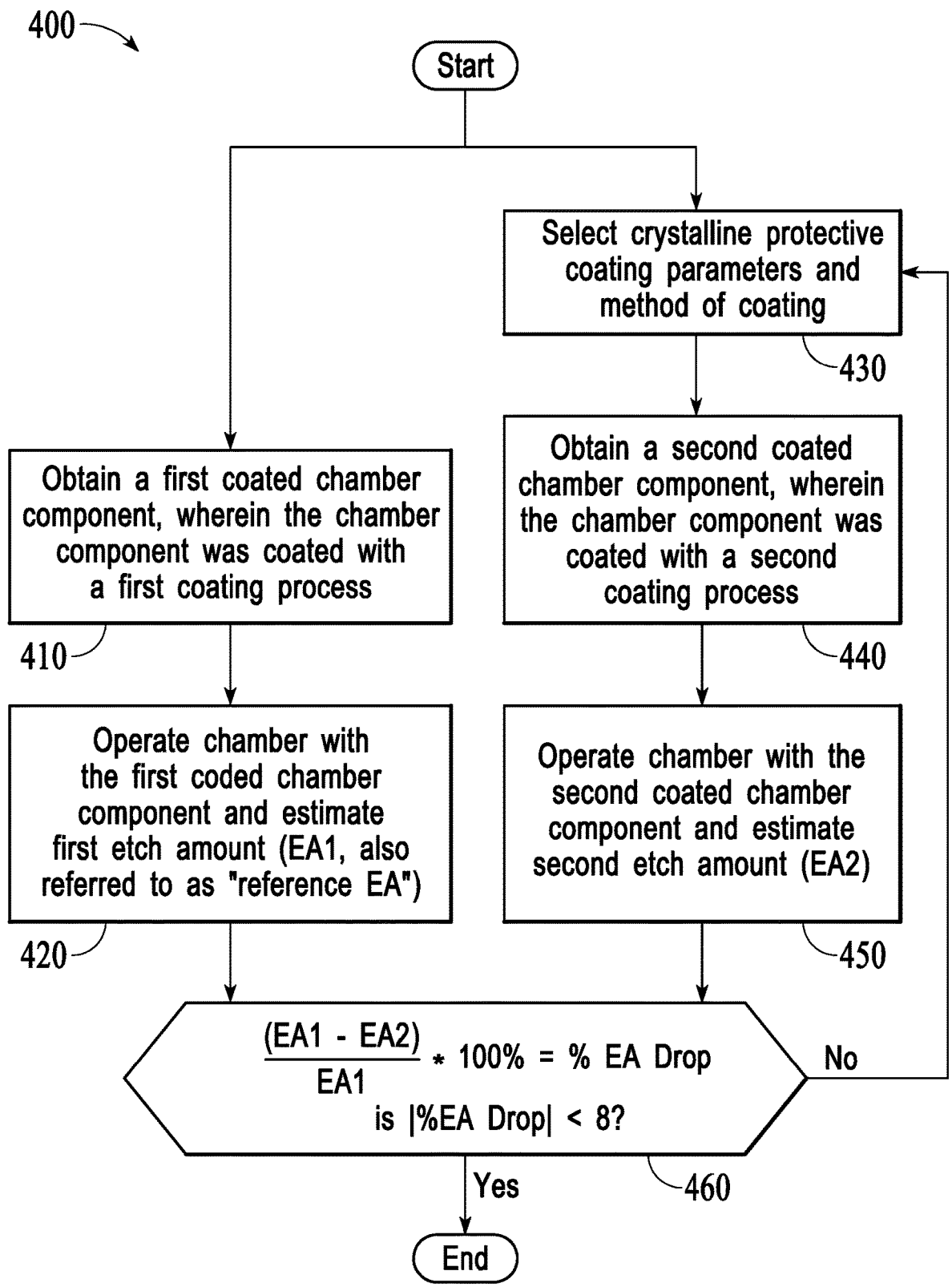
FIG. 4 is a flow chart showing a method for controlling the percent etch amount drop associated with a newly coated chamber component by controlling the properties of the poly-crystalline protective coating on the newly coated chamber component, in accordance with an embodiment.

FIG. 4 is a flow chart showing a method 400 for controlling the absolute value of the percent etch amount drop associated with a newly coated chamber component by controlling the properties of the poly-crystalline protective coating on the newly coated chamber component, in accordance with an embodiment.

At block 410, a first coated chamber component may be obtained. The first coated chamber component may be coated with a first coating process that may also be referred to as a "process of record." Said process of record may yield a first coated chamber component having a poly-crystalline protective coating that yields a beneficial etch amount. For instance, when a chamber is operated with the first coated chamber component, a first etch amount is obtained, also referred to as a "reference etch amount," as a "reference EA," as a "first target etch amount," or as a "target etch amount" pursuant to block 420.

The etch amount may be measured during wafer processing. An exemplary wafer process may use nitrogen trifluoride, helium and hydrogen gas flows at 1 Torr pressure with about 300 W power supplied between two electrodes (such as a FP and a SMD). Using chamber components coated pursuant to the POR yield an etch amount (EA1). EA1 may range between about 480 Å and 540 Å, between about 490 Å and 530 Å, or between about 490 Å and 510 Å, or of about 500 Å. EA1 may reach its value in about 50-100 seconds of process, about 60-100 seconds of process, about 60 seconds of process, about 70 seconds of process, about 80 seconds of process, or about 90 seconds of process.

At block 430, certain parameters and/or a method of coating a chamber component may be selected. Exemplary, non-limiting parameters may be selected from the group consisting of the ratio of a cubic phase to a monoclinic phase (e.g., ratio of cubic yttria to monoclinic yttria), a crystallite size of at least one or cubic phase or of the monoclinic phase, a dissipation factor, a loss tangent, an impedance, or an atomic ratio of an atom of a di-atomic gas (such as, oxygen or hydrogen) to an atom of a rare earth metal in a rare earth oxide that may comprise the majority of the composition of the coating (such as, yttrium), and combinations thereof.

At block 440, a second coated chamber component may be obtained. The second coated chamber component may be coated with a second coating process. The second coating process may be different from the first coating process. The coated chamber components may be obtained from a single source or from different sources. In some embodiments, the coated chamber components may be produced by the same entity that uses the coated chamber components to assess the resulting etch amount. In other embodiments, the coated chamber components may be produced by different entity(ies) from the entity(ies) that uses the coated chamber components to assess the resulting etch amount.

At block 450, a chamber with the second coated chamber component may be operated to yield a second etch amount. The chamber with the second coated chamber component may be operated using the same process parameters that were used for the chamber with the first coated chamber component. The difference between the first etch amount ("reference EA" or "target EA") and the second etch amount may be referred to as an "etch amount shift." The etch amount shift divided by the first target EA and multiplied by 100% as illustrated in the equation below (and also shown in block 460) may be referred to as "percent etch amount drop" or "% EA drop:

$$\frac{(EA1 - EA2)}{EA1} * 100\% = \% \; EA \; \text{Drop}$$

To ensure consistent chamber performance, consistent wafer processing, reduced cost per wafer, efficiency, reproducibility, reliability, and extended working lifetime of a chamber component, it is beneficial to minimize the etch amount shift and the % EA drop. In other words, it is beneficial that the wafer parameters (such as etch amount) obtained during processing with the second coated chamber component are as close as possible to the target wafer parameters obtained during processing with the first coated chamber component.

In some embodiments, the absolute value of the % EA drop may be up to about 8%, up to about 7%, up to about 6%, up to about 5%, up to about 4%, up to about 3%, up to about 2%, up to about 1%, or 0%. For instance, block 460 verifies whether the absolute value of the % EA drop is greater than or equal to 8%. If the answer is yes, the process may restart at block 430, where different parameters and/or method of deposition of the poly-crystalline protective coating may be selected. However, if the answer is no, the process is complete and a coated chamber component yielding a beneficial % EA drop has been obtained.

Figure 5:
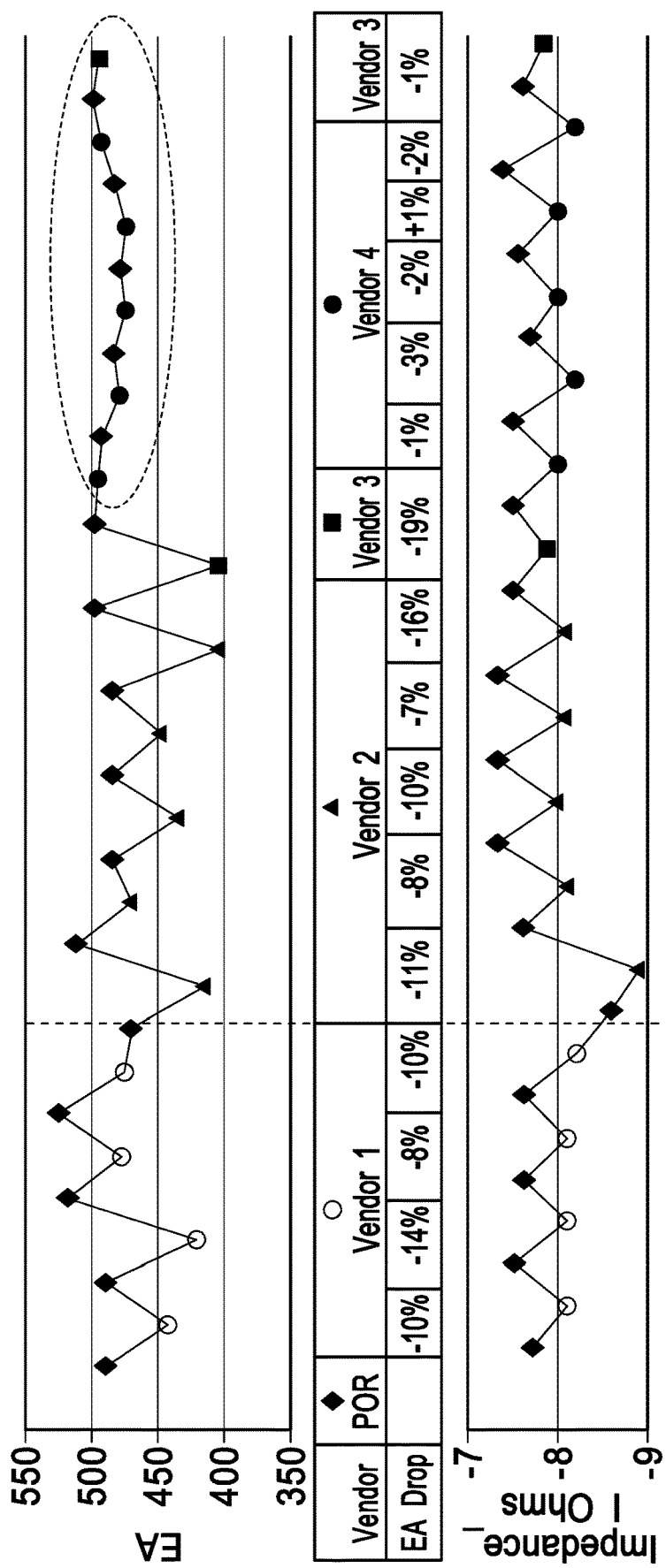
FIG. 5 summarizes the etch amount shift and impedance observed for comparative coated chamber components and inventive coated chamber components.

FIG. 5 summarizes the etch amount shift and impedance observed for comparative coated chamber components and inventive coated chamber components coated in accordance with embodiments. Etch amount values obtained from chambers comprising a first coated chamber component that was coated with a first coating process ("process of record" or "POW") are designated by a diamond shape. Etch amount values obtained from chambers comprising a second coated chamber component that was coated with a second coating process are designated by empty circles (vendor 1), triangles (vendor 2), squares (vendor 3), and filled circles (vendor 4). The chambers that tested a first coated chamber component and a second coated chamber component were the same chamber (a selective etch chamber).

As illustrated in FIG. 5, the second etch amount (EA2) obtained when using a second coated chamber component provided by vendor 1 and vendor 2, and the first result obtained from vendor 3, were lower compared to the first target etch amount (EA1) obtained when using a first coated chamber component coated using the POR. With every switch from POR, a drop in etch amount was observed.

Similarly, a first impedance ("impedance-one") value (designated by a diamond shape) was obtained from chambers comprising a first coated chamber component that was coated with the first coating process (POR). Impedance values obtained from chambers comprising a second coated chamber component that was coated with a second coating process are designated by empty circles (vendor 1), triangles (vendor 2), squares (vendor 3), and filled circles (vendor 4). The second impedance value ("impedance-two") obtained when using a second coated chamber component provided by vendor 1 and vendor 2, and the first result obtained from vendor 3, was lower compared to the first impedance value obtained when using a first coated chamber component coated using the POR. With every switch from the POR, a drop in impedance was observed.

It has been identified that controlling the properties of the poly-crystalline protective coating and the method of coating could beneficially control the etch amount shift, percent etch amount drop, and impedance when switching to a different coated chamber component. Indeed, the EA2 obtained when using a second coated chamber component provided by vendor 4 and by the second result obtained from vendor 3, were close in value to the EA1 and obtained when using the first coated chamber component coated with the POR. Similar results were observed for the values of impedance-one and impedance-two. As illustrated in FIG. 5, the drop in etch amount and in impedance is significantly reduced due to control of the properties of the poly-crystalline protective coating and the method of coating.

Different vendors may have used different coating processes and different coating process parameters (although all coating processes were a type of thermal spraying). The exact parameters used by each vendor are not fully disclosed. For plasma spraying processes, variables may be varied, including, but not limited to: type of gas and its flow rate, power, powder size and type, spray gun type, gun angle, gas combination, temperature, etc. to yield a poly-crystalline protective coating with controlled properties. Properties that may be controlled include, but are not limited to: roughness, impedance, thickness, porosity, coverage, oxygen content, poly-crystalline structure, dielectric properties, etc. Properties that were identified as particularly relevant for controlling the etch amount and percent etch amount drop are at least one of: 1) the poly-crystalline structure of the rare earth oxide (e.g., yttria) that is coated through thermal spraying on the chamber component; and 2) the dielectric properties of the coating.

The poly-crystalline structure specifically refers to the ratio of cubic to monoclinic crystalline phases in the rare earth oxide coating (e.g., in an yttria coating) and to the crystallite size of at least one of the cubic phase or of the monoclinic phase. These properties may affect the relative concentration of reactive species (such as hydrogen and fluorine radicals) in the processing environment, which in turn may affect targeted wafer level parameters (such as etch amount). In an exemplary embodiment where the coating comprises yttria, the optimal ranges for the ratio of cubic yttria to monoclinic yttria and of the crystallite size of at least one of the cubic yttria or of the monoclinic yttria are summarized in Table 1 below.

TABLE 1

Crystallinity Materials Properties Affecting Etch Amount

| Sample ID Coating Process | EA Drop (%) Etch Amount Shift | $Y_2O_3$ - Cubic | | $Y_2O_3$ - Monoclinic | | Ratio of $Y_2O_3$ Cubic/Monoclinic |
|---|---|---|---|---|---|---|
| | | Crystallite Size (nm) | Concentration (%) ±5% | Crystallite Size (nm) | Concentration (%) ±5% | |
| A | 0 | 34.0 ± 0.3 | 84.0 | 20.0 ± 5.3 | 16.0 | 5.3 |
| B | 0 | 31.6 ± 5.7 | 76.5 | 19.4 ± 4.9 | 23.5 | 3.3 |
| C | 0 | 31.6 ± 3.3 | 75.2 | 18.6 ± 1.8 | 24.8 | 3.0 |
| D | 2-3 | 34.0 ± 4.8 | 76.4 | 18.9 ± 2.5 | 23.6 | 3.2 |
| E | 2 | 32.5 ± 4.4 | 69.5 | 19.8 ± 1.8 | 30.5 | 2.3 |
| F | 2 | 32.2 ± 4.7 | 69.1 | 19.5 ± 1.6 | 30.9 | 2.2 |
| G | 8 | 55.6 ± 16.2 | 78.7 | 24.7 ± 6.2 | 20.6 | 3.8 |
| H | 16 | 60.2 ± 16.1 | 90.9 | 27.1 ± 6.4 | 8.9 | 10.2 |
| I | 12 | 62.6 ± 7.0 | 94.6 | 26.6 ± 7.5 | 5.4 | 17.5 |
| J | 19 | 28.0 ± 5.5 | 34.9 | 19.8 ± 2.8 | 65.1 | 0.54 |
| K | 0 | 34.9 ± 4.1 | 82.9 | 21.7 ± 5.8 | 17.1 | 4.8 |

As seen in Table 1, the optimal ratio of cubic yttria to monoclinic yttria range from about 1:1 to about 9:1, from about 2:1 to about 6:1, or from about 3:1 to about 5.5:1. Additionally, or alternatively, the optimal crystallite size for at least one of the cubic yttria or the monoclinic yttria is up to about 54 nm, up to about 50 nm, up to about 40 nm, or up to about 35 nm. The combination of these values were observed for the coating of chamber components coated pursuant to coating processes A, B, C, D, E, F, and K (as set forth in table 1). Indeed, chambers comprising chamber components coated pursuant to processes A, B, C, D, E, F, and K, yielded an absolute value of a percent etch amount drop of less than 8%, less than 5%, and less than 3%. Furthermore, in some instances the percent etch amount drop was zero. In contrast, chamber components coated pursuant to coating process G, H, I, and J either a) had a ratio of cubic yttria to monoclinic yttria that is too high or too low or b) had a crystallite size of at least one of the cubic yttria or of the monoclinic yttria that is too high. Indeed, chambers comprising chamber components coated pursuant to processes G, H, I, and J, yielded an unfavorable absolute value of the percent etch amount drop of 8% or greater.

The dielectric properties refer to the high resistance which may occur in an insulating layer (i.e. layer capacitance) and lead to a loss tangent (i.e. dissipation factor) that could affect the RF (radio frequency) power coupling to the processing plasma environments which are relevant to achieving targeted wafer level parameters (e.g., etch amount). In other words, RF power voltages may be sent to a chamber component (e.g. an electrode such as a faceplate or a selectivity modulating device) to create a plasma. The efficiency with which the power is delivered to the chamber components creates a plasma that may be affected by a loss tangent (also known as dissipation factor). The greater the loss tangent or dissipation factor is, the more the power delivered to create a plasma is reduced. Reducing the amount of power sent to create a plasma may lead to less radicals (e.g., fluorine and/or hydrogen radicals) and to a lower etch amount.

Figure 6:
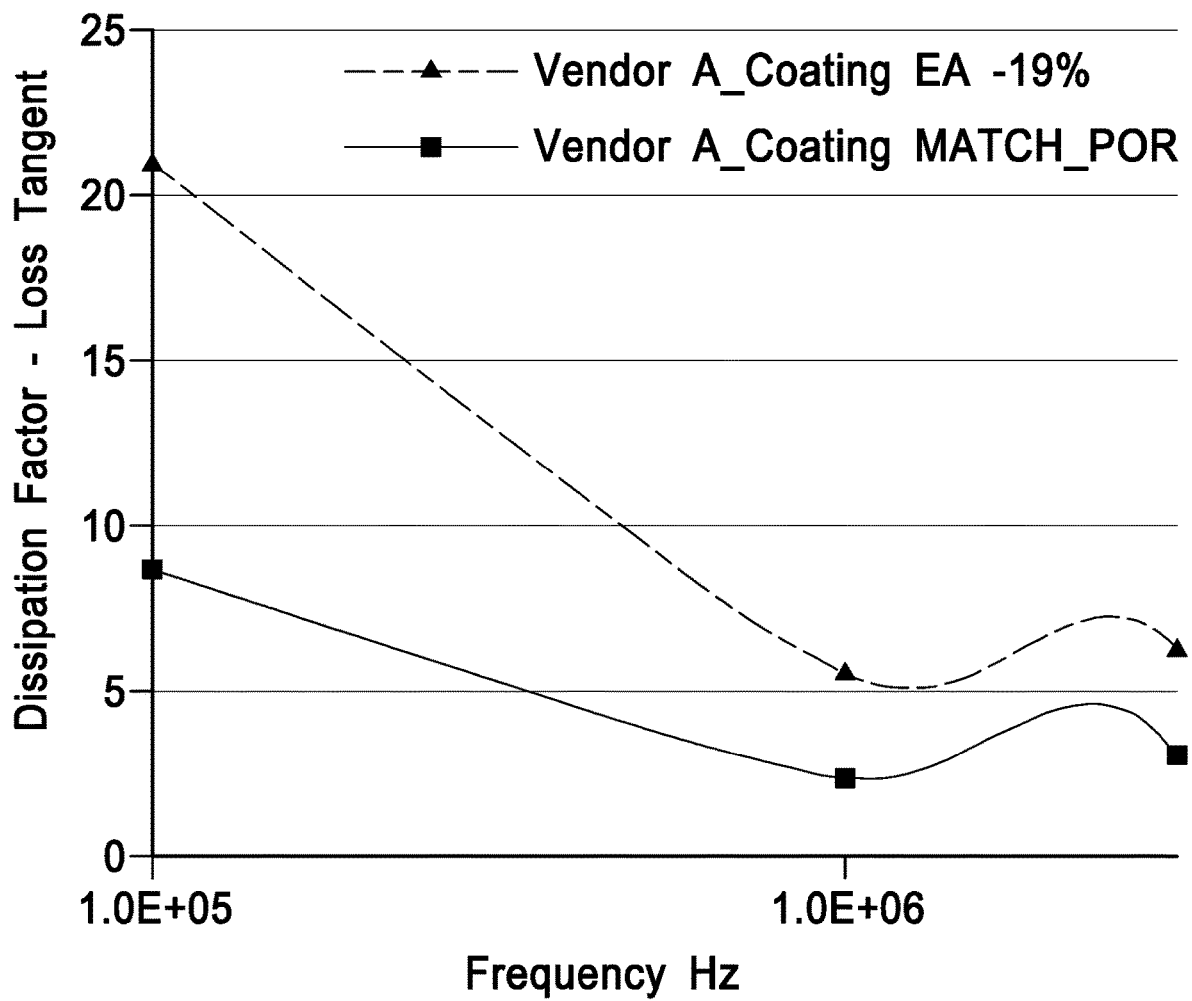
FIG. 6 depicts the dissipation factor observed for a comparative coating and an inventive coating.

FIG. 6 illustrates the dissipation factor observed for a comparative coating and an inventive coating in accordance with embodiments. FIG. 6 illustrates a plot that shows the loss tangent (dissipation factor) as a function of frequency. The line represented by the square-shaped data points summarizes the loss tangent measured from a coated coupon that yielded a percent etch amount drop of zero. The line represented by the triangle-shaped data points summarizes the loss tangent measured from a coated coupon that yielded a percent etch amount drop of 19%. This data illustrates the relevancy of the loss tangent—dissipation factor on the final targeted wafer properties (such as etch amount).

It should be noted that the loss tangent values were tested on coated coupons and the values depicted in FIG. 6 may or may not apply when testing actual coated chamber components. While the loss tangent—dissipation factor may be a relevant parameter in controlling the final targeted wafer parameters, the values of FIG. 6 should not be construed as limiting.

It is believed that the loss tangent—dissipation factor may be affected by the amount of di-atomic gas (e.g., oxygen, nitrogen, hydrogen) used in the thermal spray method (e.g., in a plasma spray method). A non-limiting theory contemplated is that a di-atomic gas carries significantly more heat as compared to a mono-atomic gas (such as argon), and the heat may help in maintaining the high temperature characteristic to coatings deposited by thermal spraying in close proximity to the relatively cold surfaces to be coated. For instance, coatings deposited by thermal spraying (such as plasma spraying) may reach temperatures of 1500-3000° C., or of 2000-2500° C. In comparison, the surface to be coated may be at temperatures ranging from about room temperature up to about 500° C., or of up to about 200° C., which are considerably colder than the thermal sprayed coating.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Reference throughout this specification to numerical ranges should not be construed as limiting and should be understood as encompassing the outer limits of the range as well as each number and/or narrower range within the enumerated numerical range.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A coated chamber component comprising:
   a chamber component; and
   a poly-crystalline protective coating comprising thermal sprayed melted yttria powder that has solidified at a surface of the chamber component, the poly-crystalline protective coating comprising cubic yttria and monoclinic yttria,
   wherein a ratio of the cubic yttria to the monoclinic yttria ranges between about 1:1 and about 9:1,
   wherein at least one of the cubic yttria or the monoclinic yttria has a crystallite size of up to about 54 nm, and
   wherein the poly-crystalline protective coating has a thickness of 50 nm to 1 mm.

2. The coated chamber component of claim 1,
   wherein a first target etch amount (EA1) of a first thickness of material removed from the poly-crystalline protective coating is obtained in a first instance of a chamber with the coated chamber component that was coated with a first coating process, wherein a second etch amount (EA2) of a second thickness of material removed from the poly-crystalline protective coating is obtained in a second instance of the chamber with the coated chamber component that was coated with a second coating process that is different from the first coating process, wherein an absolute value of a % etch amount drop (% EA Drop) defined according to equation (I) is up to about 8%:

$$\frac{(EA1 - EA2)}{EA1} * 100\% = \% \ EA \ \text{Drop}. \quad (I)$$

3. The coated chamber component of claim 2, wherein the chamber comprises a selective etch chamber.

4. The coated chamber component of claim 1, wherein a ratio (O/Y) of an atomic concentration of oxygen (O) to an atomic concentration of yttrium (Y) in the poly-crystalline protective coating ranges between 1.4 and 1.6.

5. The coated chamber component of claim 1, wherein the chamber component comprises a metal.

6. The coated chamber component of claim 1, wherein the chamber component is selected from the group consisting of a face plate, a selectivity modulating device that modulates etch selectivity, and a showerhead.

7. The coated chamber component of claim 1, wherein the ratio of the cubic yttria to the the monoclinic yttria ranges between about 2:1 and about 6:1.

8. The coated chamber component of claim 1, wherein the at least one of the cubic yttria or the monoclinic yttria has a crystallite size of up to about 40 nm.

9. The coated chamber component of claim 1, wherein the at least one of the cubic yttria or the monoclinic yttria has a crystallite size of up to about 35 nm.

10. A poly-crystalline protective coating comprising cubic yttria and monoclinic yttria,
    wherein a ratio of the cubic yttria to the monoclinic yttria ranges between about 1:1 and about 9:1,
    wherein at least one of the cubic yttria or the monoclinic yttria has a crystallite size of up to about 54 nm,
    wherein a ratio (O/Y) of an atomic concentration of oxygen (O) to an atomic concentration of yttrium (Y) in the poly-crystalline protective coating ranges between about 1.4 and about 1.6,
    wherein the poly-crystalline protective coating comprises thermal sprayed melted yttria powder that has solidified onto a surface, and
    wherein the poly-crystalline protective coating has a thickness of 50 nm to 1 mm.

11. The poly-crystalline protective coating of claim 10, wherein the ratio of the cubic yttria to the monoclinic yttria ranges between about 2:1 and about 6:1.

12. The poly-crystalline protective coating of claim 10, wherein the at least one of the cubic yttria or the monoclinic yttria has a crystallite size of up to about 40 nm.

13. The poly-crystalline protective coating of claim 10, wherein the at least one of the cubic yttria or the monoclinic yttria has a crystallite size of up to about 35 nm.

14. The coated chamber component of claim 1, wherein the poly-crystalline protective coating has a thickness of 10-100 nm.

15. The coated chamber component of claim 1, wherein the poly-crystalline protective coating has a thickness of 20-50 nm.

16. The coated chamber component of claim 1, wherein the poly-crystalline protective coating has a thickness of 200-400 nm.

17. The coated chamber component of claim 1, wherein the poly-crystalline protective coating has a loss tangent of less than 10 at a frequency of 1.0 E+05.

18. The coated chamber component of claim 1, wherein a ratio of crystallite size of the cubic yttria to crystallite size of the monoclinic yttria is between 1.6:1 and 1.8:1.

19. The coated chamber component of claim 1, wherein the poly-crystalline protective coating has a porosity of 2-5%.

* * * * *

UNITED STATES PATENT AND TRADEMARK OFFICE
CERTIFICATE OF CORRECTION

PATENT NO. : 11,047,035 B2
APPLICATION NO. : 16/274141
DATED : June 29, 2021
INVENTOR(S) : Ramesh Gopalan et al.

Page 1 of 1

It is certified that error appears in the above-identified patent and that said Letters Patent is hereby corrected as shown below:

In the Claims

Claim 7, Column 13, Line 34, delete the third "the"

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*